United States Patent
Shirley

[11] Patent Number: 5,831,909
[45] Date of Patent: *Nov. 3, 1998

[54] MEMORY DEVICE TRACKING CIRCUIT

[75] Inventor: Brian M. Shirley, Boise, Id.

[73] Assignee: Micron Technology, Inc., Boise, Id.

[*] Notice: The term of this patent shall not extend beyond the expiration date of Pat. No. 5,657,277.

[21] Appl. No.: 872,081

[22] Filed: Jun. 10, 1997

Related U.S. Application Data

[63] Continuation of Ser. No. 636,280, Apr. 23, 1996, Pat. No. 5,657,277.

[51] Int. Cl.$^6$ ................................................... G11C 16/04
[52] U.S. Cl. ............................ 365/189.07; 365/189.09; 365/230.06; 365/149
[58] Field of Search ........................ 365/189.07, 230.06, 365/149, 189.09; 326/105; 327/50

[56] References Cited

U.S. PATENT DOCUMENTS

| | | | |
|---|---|---|---|
| 4,421,996 | 12/1983 | Chuang et al. | 307/530 |
| 4,727,519 | 2/1988 | Morton et al. | 365/233 |
| 5,424,985 | 6/1995 | McClure et al. | 365/194 |
| 5,528,548 | 6/1996 | Horiguchi et al. | 365/226 |
| 5,604,712 | 2/1997 | Priebe | 365/230.06 |
| 5,657,277 | 8/1997 | Shirley | 365/189.07 |

OTHER PUBLICATIONS

"Copy of PCT Search Report by P. Schenkels for Application No. PCT/US 97/06600", 2 pages, (Aug. 29, 1997).

"XP 002013200", *IBM Technical Disclosure Bulletin*, vol. 28, No. 7, 3 pages, (Dec. 1985).

*Primary Examiner*—Huan Hoang
*Attorney, Agent, or Firm*—Schwegman, Lundberg, Woessner & Kluth, P.A.

[57] ABSTRACT

Tracking circuitry is described for use in a memory device. The tracking circuitry can be used to monitor word line voltages in a dynamic random access memory (DRAM) and includes a comparator circuit which compares a simulated word line signal to a digit line equilibrate bias voltage. The equilibrate bias voltage is generated using either memory column circuitry or a linear resistor voltage divider.

29 Claims, 5 Drawing Sheets

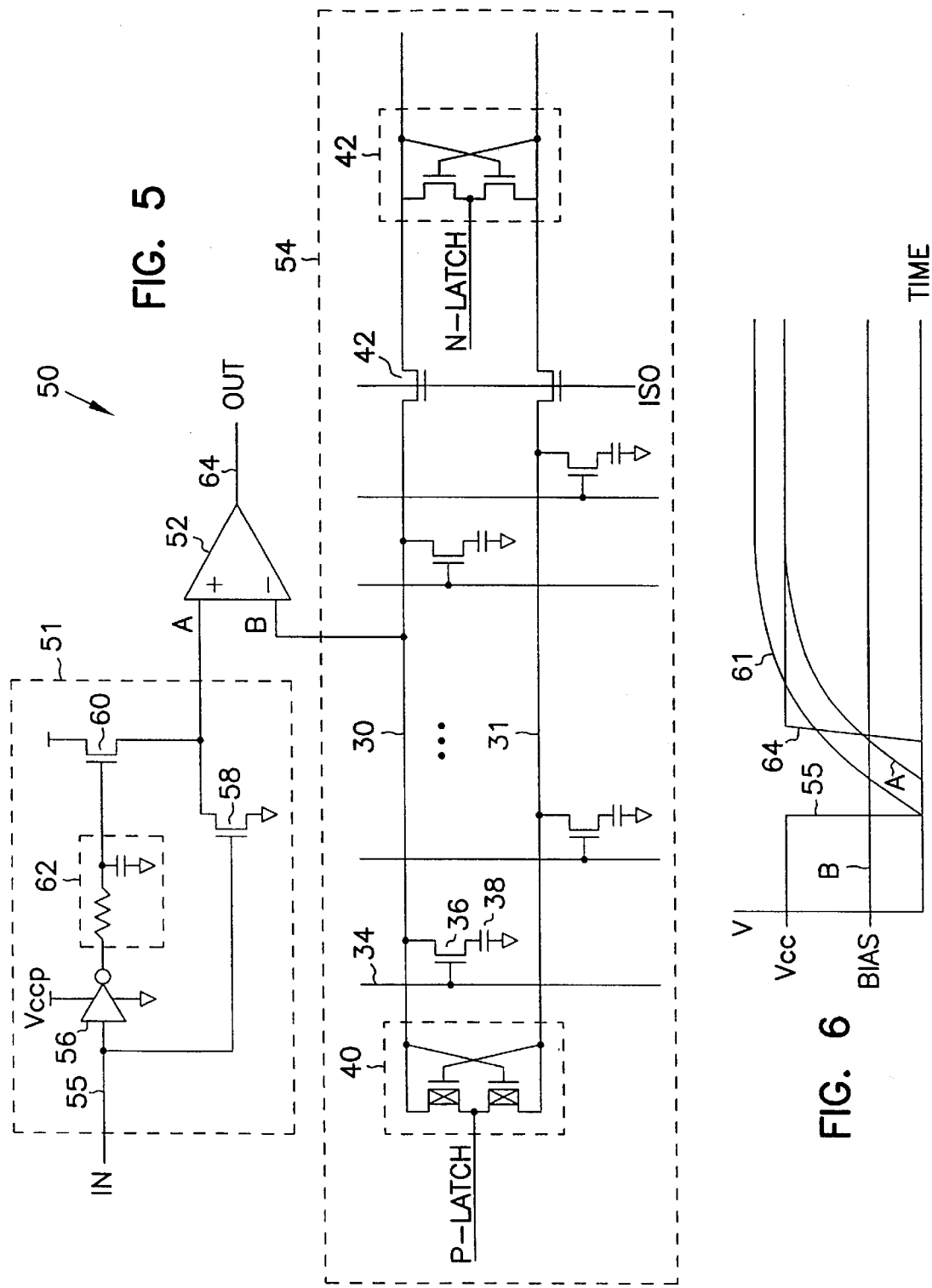

MEMORY DEVICE TRACKING CIRCUIT

This application is a continuation of U.S. patent application Ser. No. 08/636,280, filed Apr. 23, 1996, now U.S. Pat. No. 5,657,277.

TECHNICAL FIELD OF THE INVENTION

The present invention relates generally to memory devices and in particular the present invention relates to tracking circuitry provided in the memory devices.

BACKGROUND OF THE INVENTION

Memory devices such as dynamic random access memories (DRAM) typically perform sequential operations such that certain operations cannot be initiated until a prior event has been completed. To insure that a prior event was completed, a "time-out" circuit could be used to delay the initiation of a subsequent event. In operation the start of a first event activates a time-out circuit, after a predetermined time the time-out circuit enables the start of a second event. While this type of circuit fulfills some of the needs of the memory device, a worst case time-out must be used to insure that all variations in voltage, temperature and fabrication have been accounted for. Thus, an undesirable wait time is often experienced between the termination of the first event and the start of the subsequent second event.

Tracking circuitry can be included in the memory devices to allow the memory devices to operate more efficiently by reducing wait time experienced as a result of time-out circuits. The tracking circuitry monitors internal signals to determine when an event has occurred. For example, DRAM memory cells are typically arranged in an array having rows and columns. Data is read from the memory by activating a row, referred to as a word line, which couples memory cells corresponding to that row to digit lines which define columns of the array. Internal circuitry such as a sense amplifier is used to detect voltage changes on the digit lines. It will be appreciated that the sense amplifier circuitry should not be activated until a memory cell has been coupled to the digit line. To insure that a memory cell has been fully coupled to a digit line, the word line signal is monitored by a tracking circuit.

FIG. 1a illustrates a word line tracking circuit 5 which uses an inverter 6 having an input (Vin) connected to receive a word line activation signal. The output of the inverter is connected to a switching circuit 7 through a coupling line designed to simulate the resistance and capacitance characteristics of a word line. The tracking circuit 8 of FIG. 1b includes an inverter and a switching circuit which switches when the input is approximately ½ Vcc. The output of the switching circuits of FIGS. 1a and 1b are used to initiate an operation performed during a memory read. The tracking circuits of FIGS. 1a and 1b do not accurately track variations in voltage, temperature, or process conditions which occur during fabrication and operation of the memory devices.

For the reasons stated above, and for other reasons stated below which will become apparent to those skilled in the art upon reading and understanding the present specification, there is a need in the art for tracking circuitry which accurately tracks word line signals over a wide range of variables.

SUMMARY OF THE INVENTION

The above-mentioned problems with tracking circuitry and other problems are addressed by the present invention and which will be understood by reading and studying the following specification. Tracking circuitry is described which accurately tracks word line signals in a memory device.

In particular, the present invention describes a memory device tracking circuit comprising a comparator circuit having a first input and a second input. The comparator circuit produces an output signal which indicates when a word line signal reaches a predetermined voltage. The tracking circuit further comprises a word line simulation circuit coupled to the first input, and a bias circuit coupled to the second input for providing a bias voltage to the comparator circuit which adjusts to changes in an external voltage supply.

The bias circuit can comprise a digit line simulation circuit where the digit line simulation circuit comprises a pair of dummy digit lines, and memory cell access devices. Alternately, the bias circuit can comprise a first linear resistor having one node connected to the second input and a second node connected to a lower voltage level, and a second linear resistor having one node connected to the second input and a second node connected to an upper voltage level.

In an alternate embodiment, the tracking circuit can include a second comparator circuit having a first input coupled to the word line simulation circuit and a second input coupled to a predetermined internal voltage, and a logic gate having a first input connected to the first and second comparator circuits for producing an output signal which indicates when a word line signal reaches a predetermined voltage.

In another embodiment, a memory device is described which comprises voltage supply inputs for receiving an external voltage supply having an upper voltage level, a plurality of memory cells arranged in rows and columns, and a plurality of access devices coupled between the plurality of memory cells and a digit line. A plurality of word lines are coupled to the plurality of access devices. The plurality of word lines communicate word line signals to selectively activate the plurality of access devices. The memory further comprises a tracking circuit for tracking the word line signals and producing an output which indicates when the word line signals reach a predetermined voltage level. The tracking circuit comprises a first comparator circuit having a first input and a second input, a word line simulation circuit coupled to the first input, and a bias circuit coupled to the second input for providing a bias voltage to the first comparator circuit.

In yet another embodiment, a method of reading data from a memory device is described. The method comprises the steps of producing a bias voltage using a bias circuit, the bias voltage approximates a digit line equilibrate voltage over temperature and voltage supply variations, comparing a word line signal to the bias voltage, and producing an output signal when the word line signal reaches a predetermined voltage differential above the bias voltage.

BRIEF DESCRIPTION OF THE DRAWINGS

FIG. 5 is one embodiment of a tracking circuit of the present invention;

FIG. 6 is a graph of the operation of the tracking circuit of FIG. 5;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1A:
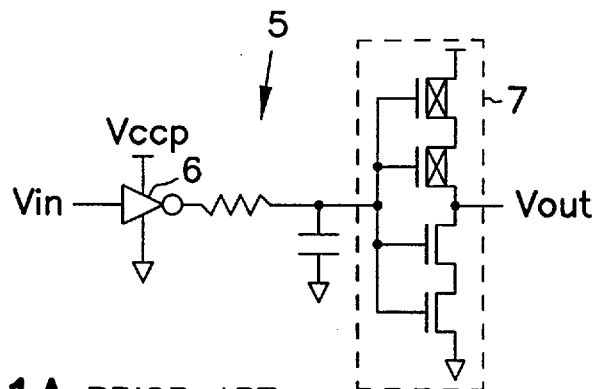
FIG. 1a is a schematic of a prior art tracking circuit.
Figure 1B:
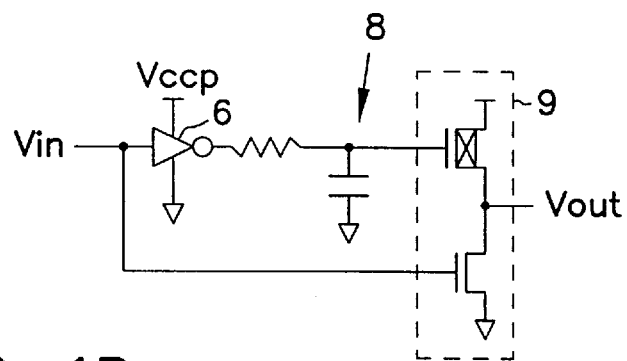
FIG. 1b is a schematic of another prior art tracking circuit.
Figure 2:
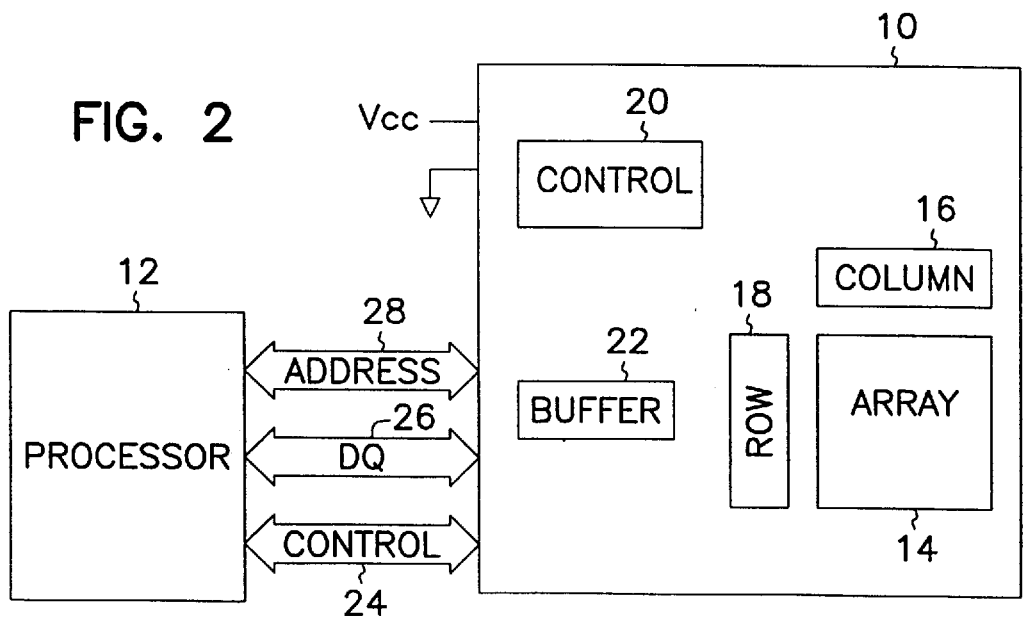
FIG. 2 is a block diagram of a dynamic memory incorporating the present invention.

FIG. 2 illustrates a simplified block diagram of a DRAM 10 incorporating the features of the present invention. The memory device can be coupled to a processor 12 such as a microprocessor of a personal computer. The memory device 10 includes a memory array 14 having rows and columns of memory cells. Column decoder 16 and row decoder 18 are provided to access the memory array in response to address signals provided by the processor 12 on address communication lines 28. Data communication is conducted via I/O buffer circuitry 22 and data communication lines 26 (DQ). Internal control circuitry 20 accesses the memory array in response to commands provided by the processor 12 on control lines 24. The control lines can include Row Address strobe (RAS*), Column Address Strobe (CAS*), Write Enable (WE*), and Output Enable (OE*). The internal control circuitry 20 also includes tracking circuitry described in detail below. An external power supply provides power to the memory and has an upper voltage referred to herein as Vcc.

Figure 3:
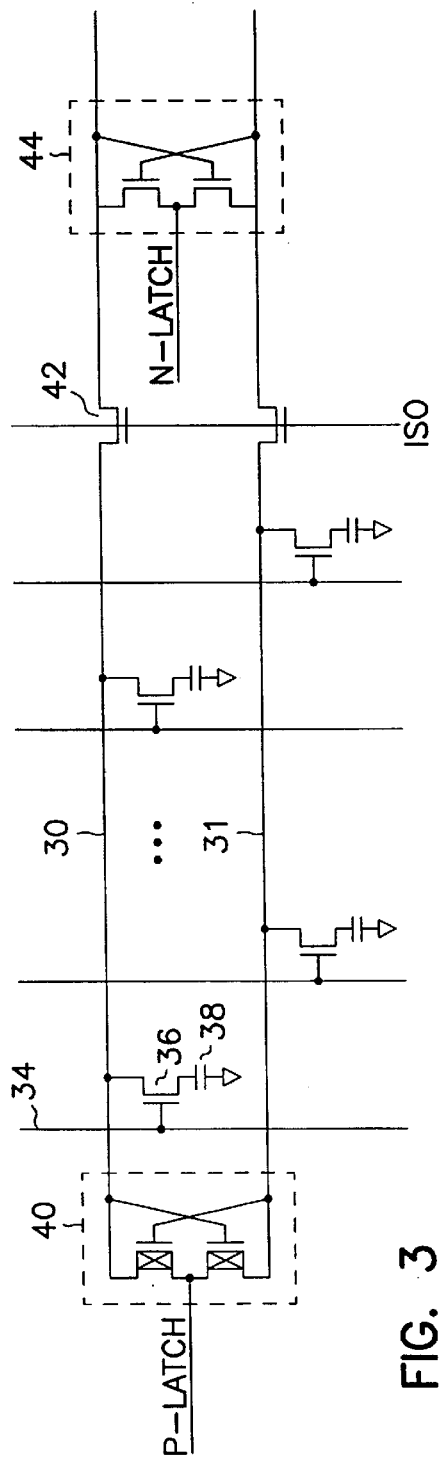
FIG. 3 is a schematic of a digit line pair of the memory of FIG. 2.

FIG. 3 is a schematic diagram of a portion of array 14 of memory 10. Digit lines 30 and 31, as known to those skilled in the art, are used to couple memory cells 38 to I/O buffer circuitry 22 for data communication with the external processor. Each memory cell 3 8 is connected to an access transistor 36. The gate of the access transistor is connected to a word line 34. The digit lines 30 and 31 are coupled to a p-sense amplifier circuit 40 and a shared n-sense amplifier circuit 44 via isolation transistors 42. The sense amplifier circuits 40 and 44 comprise cross-coupled transistors having an activation signal P-Latch and N-Latch, respectively. The memory of FIGS. 2 and 3 is intended to provide a general description of a DRAM for purposes of understanding the present invention, therefore, a detailed discussion of all the features of the DRAM have not been provided.

Figure 4:
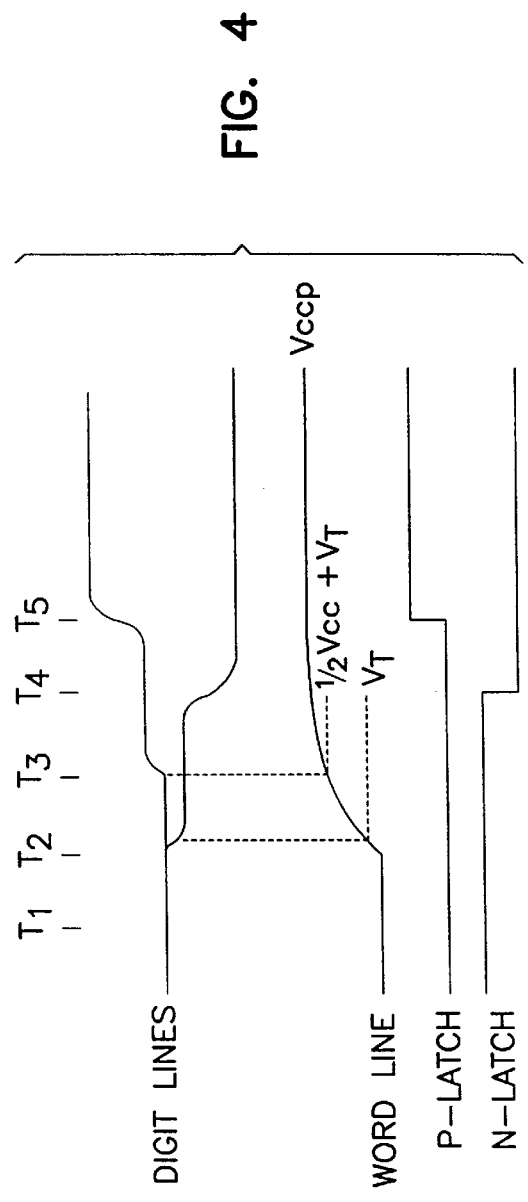
FIG. 4 is a timing diagram of the operation of the memory of FIGS. 2 and 3.

Referring to the timing diagram of FIG. 4, a method of reading data from the memory cells 38 is explained. At time T1 the digit lines 30 and 31 are equilibrated to a predetermined voltage level, preferably ½ Vcc. The method used to equilibrate the digit lines can comprise shorting together two digit lines which were previously driven to opposite power rails. The resultant equilibrate voltage will be approximately ½ Vcc. Alternately, an equilibrate circuit can be used which couples the digit lines to an internal voltage. One such internal voltage is referred to as DVC2 which is also approximately ½ Vcc, but may be different from the equilibrate voltage derived by shorting the digit lines. In some memory devices both methods of equilibration are used in combination.

At time T2, the word line signal begins to transition high on a word line 34. The word line signal preferably has an upper voltage level which is greater than Vcc, known as a pumped voltage or Vccp. It will be appreciated that the word lines are both highly resistive and capacitive. The rise time of the word line, therefore, is dependant upon the electrical characteristics of the word line. Further, processing variables experienced by integrated circuits on a single silicon wafer and between fabrication lots result in a range of potential word line operating characteristics.

Access transistors 36 begin to couple the memory cells to the digit lines as the word line voltage increases. That is, when the word line signal is an n-channel threshold voltage (Vt) above zero volts (ground), a digit line begins to decrease in voltage if the memory cell 38 is discharged. If the memory cell is storing a voltage which is greater than the digit line equilibrate voltage (½ Vcc), the access transistor couples the digit line to the memory cell when the word line is a Vt above the equilibrate voltage (approximately ½ Vcc+Vt) as shown at time T3. Both cases are illustrated in FIG. 4, however, only one digit line will change voltage during a memory read operation. At time T4 the N-LATCH signal transitions low to drive the digit line having the lowest voltage to the lower power rail (ground). At time T5 the P-LATCH signal transitions high to drive the complementary digit line to the upper power rail (Vcc).

To minimize the time needed to read data from the memory cells, the N-Latch signal of the n-sense amplifier 44 should be strobed as soon as the memory cell is fully coupled to the digit line. That is, the time differential between T3 and T4 should be decreased to zero. Time T3 corresponds to the moment when the word line signal is a threshold voltage above the digit line equilibrate level. However, as stated above, predicting when the word line reaches this voltage is not possible for all memory circuits due to variations in supply voltage, temperature, and fabrication. A tracking circuit is therefore included in the control circuit 20 of the memory 10 which provides an active output signal when the word line voltage reaches a predetermined voltage level, preferably ½ Vcc+Vt.

Tracking Circuit

FIG. 5 illustrates a tracking circuit 50 which includes a simulator circuit 51, a comparator 52, and a bias circuit 54. The bias circuit is fabricated as a column of the memory array 14 having a pair of digit lines, access transistors and sense amplifiers similar to those described above with reference to FIG. 3. The column circuitry can also include isolation circuitry 42 and memory cells 38. One of the digit lines of the bias circuit 54 is coupled to one of the inputs of comparator 52. The bias voltage is therefore equal to, and accurately tracks the equilibrate voltage of the memory array digit lines. It will be appreciated that the bias circuit 54 is a non-operational column which is provided as a dummy circuit.

The second input of the comparator is connected to transistor 58 which has its gate connected to input 55. The input is also connected to inverter 56. The output of inverter 56 is coupled to the gate of transistor 60 through coupling line 62. The coupling line 62 is fabricated to simulate the electrical characteristics of a word line on the memory device and is illustrated in FIG. 5 as a resistor and capacitor network.

In operation, the tracking circuit of FIG. 5 provides an output signal 64 which transitions to a high state when a word line signal is at an n-channel threshold voltage above the digit line equilibrate voltage. The simulator circuit 51 maintains a signal on input A of the comparator which is a threshold voltage below the gate of transistor 60 (simulated word line signal). The input signal 55 is an internal signal generated when a word line is activated and can be provided by a row decode circuit. Because the input signal provided on input 55 is normally high, input A of the comparator is held low through transistor 58. When the input signal transitions low indicating that a word line signal has been activated, the inverter circuit 56 begins to drive line 62 to Vccp. The signal on the gate of transistor 60 has a rise time dependant upon the electrical characteristics of line 62, as shown in FIG. 6 and labeled 61. When the voltage of input A of the comparator exceeds the bias voltage of input B, the output 64 of the comparator transitions high to initiate a read operation such as strobing the N-Latch signal. It will be appreciated that the input signal provided on input 55 can be generated using a row decoder. Further, a row driver circuit can be substituted for the inverter 56.

Figure 8:
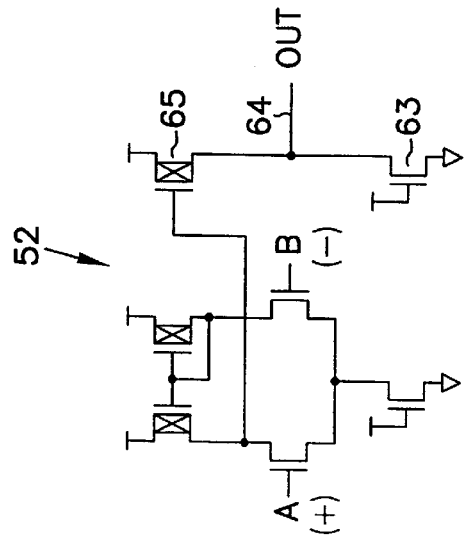
FIG. 8 is a schematic diagram of the comparator of FIG. 7.
Figure 7:
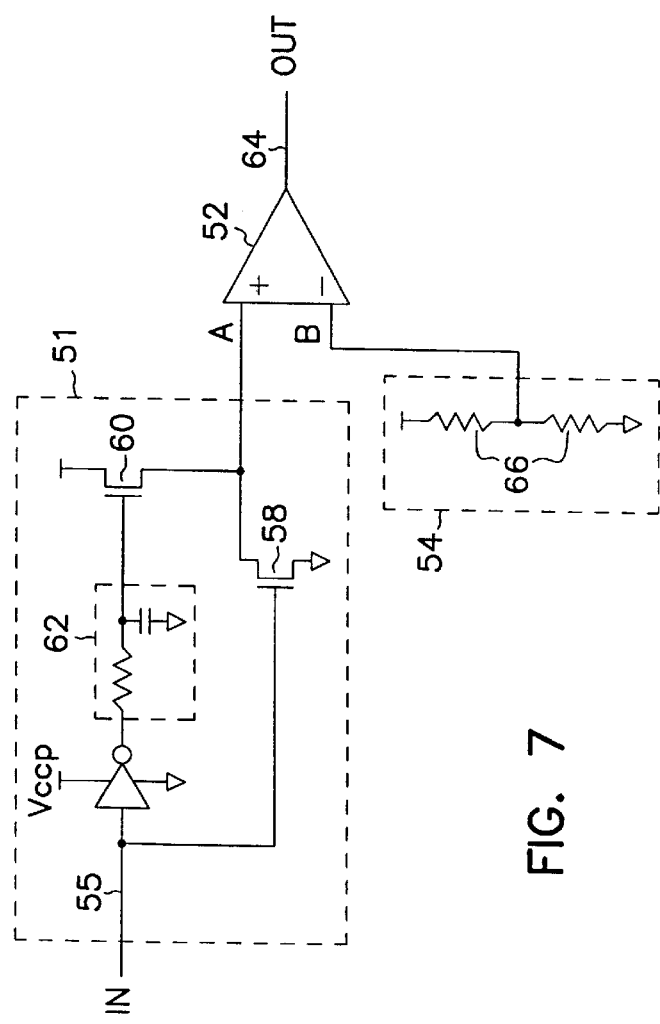
FIG. 7 is another embodiment of a tracking circuit of the present invention.

The tracking circuit of FIG. 5 requires a rather large semiconductor area to implement due to the layout of the bias circuit 54. An alternate embodiment which requires less area, shown in FIG. 7, includes a bias circuit 54 which comprises a pair of matched linear resistors 66 arranged as a voltage divider. The value of the resistors are selected to set the bias voltage on input B of the comparator to the digit line equilibrate voltage (about ½ Vcc). Since the resistors are matched, they are not susceptible to process variations. Further, because the resistors are linear, they are not susceptible to voltage and temperature variations. The operation of this circuit is similar to the circuit of FIG. 5 and illustrated in FIG. 6. FIG. 8 illustrates a DC-biased differential pair circuit which can be used for comparator 52. The output is normally pulled low through transistor 63. However, when input A exceeds input B, transistor 65 is activated and the output is pulled high.

Figure 9:
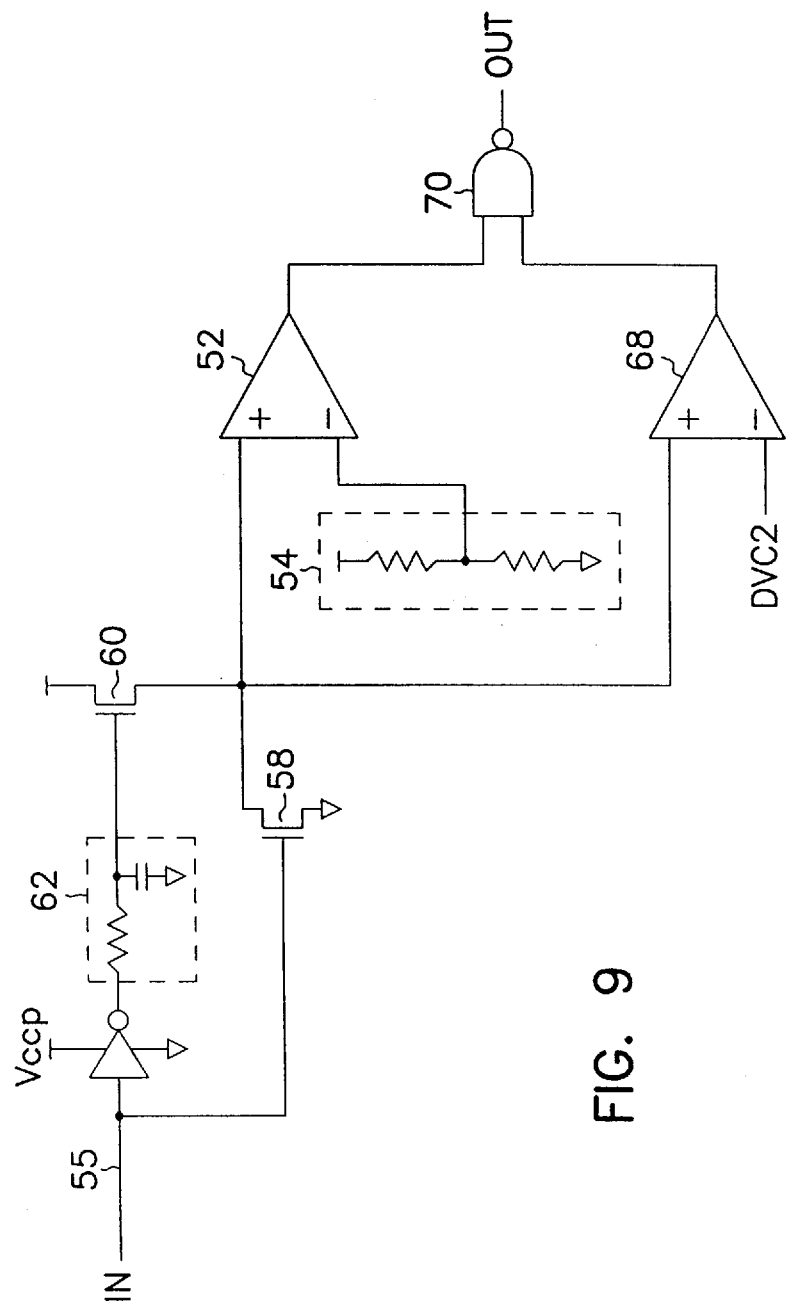
FIG. 9 is another embodiment of a tracking circuit of the present invention.

Referring to FIG. 9, an additional comparator circuit 68 can be added to the tracking circuit of FIG. 8. Internal voltage (DVC2) which is approximately ½ Vcc is used as a bias voltage for comparator 68. The outputs of both comparators are sent through NAND gate 70 to provide an output which assures that a worst case trip point is provided. This embodiment allows for the use of both equilibrate methods described above in combination. That is, some memory devices short the digit line pairs together and subsequently couple the digit lines to an internal voltage supply, such as DVC2. If variations in the supply voltage are experienced, the equilibrate voltages produced by these two methods may be slightly different. By using the two comparator circuits of FIG. 9 any differential in equilibrate levels is compensated for. The output of this circuit would be the inverse of the outputs of the tracking circuits of FIGS. 5 and 7. Comparator 68 can be the same differential pair circuitry used in one embodiment of comparator 52. DVC2 is one representative internal voltage used and can be replaced with another internal voltage used for equilibration.

Conclusion

Tracking circuitry has been described which indicates when a word line signal has reached a predetermined voltage level. The tracking circuitry accurately tracks the word line signal over temperature, voltage, and fabrication variables. The tracking circuitry includes a comparator circuit which compares a simulated word line signal to a digit line equilibrate bias voltage. The equilibrate bias voltage can be generated using either memory column circuitry or a linear resistor voltage divider. Additional circuitry has been described which allows internal voltages such as DVC2 to be included in the bias circuit for multiple compares.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device tracking circuit comprising:
   a first comparator that produces an output signal indicating when a word line signal reaches a predetermined voltage;
   a bias circuit coupled to a first input of the first comparator, the bias circuit producing a bias voltage which adjusts to changes in an external voltage supply; and
   a word line simulation circuit coupled to a second input of the first comparator, the word line simulation circuit comprising:
   a first n-channel transistor coupled between the second input and a voltage potential which is less than the bias voltage, the first n-channel transistor having a gate coupled to an input signal that is high when a word line signal is inactive;
   a driver having an input and an output, the driver driving an output signal at the driver output when an active word line signal is provided on the driver input;
   a resistor and capacitor network having electrical characteristics substantially equal to a word line of the memory device and coupled to the output of the driver; and
   a second n-channel transistor of a type used for a memory cell access transistor, the second transistor being coupled between the external voltage and the second input, the second n-channel transistor having a gate coupled to the resistor and capacitor network.

2. The memory device tracking circuit of claim 1 wherein the bias circuit is a voltage divider coupled between a lower voltage level and the upper voltage level of the external voltage supply.

3. The memory device tracking circuit of claim 1 wherein the bias circuit is a digit line simulation circuit comprising a pair of digit lines coupled to non-operational memory cells and further coupled to sense amplifiers, the memory cells further coupled to word lines through n-channel access transistors.

4. The memory device tracking circuit of claim 1, further comprising:
   a second comparator having a first input coupled to the word line simulation circuit and a second input coupled to a predetermined internal voltage; and
   a NAND gate having a first input coupled to the first comparator and a second input coupled to the second comparator, wherein the NAND gate produces the output signal indicating when a word line signal reaches the predetermined voltage.

5. Means for tracking a word line signal in a memory device, the tracking means comprising:
means for producing a first signal indicating when the word line signal reaches a first predetermined voltage;
means for simulating a word line in the memory device coupled to the means for producing a first signal; and
means for providing a bias voltage which adjusts to changes in an external voltage supply and coupled to the means for producing a first signal.

6. The means for tracking a word line signal of claim 5 wherein the means for producing a bias voltage comprises means for simulating a digit line in the memory device.

7. The means for tracking a word line signal of claim 5 wherein the means for producing a bias voltage comprises a voltage divider coupled between a lower voltage level and an upper voltage level.

8. The means for tracking a word line signal of claim 5 further comprising:
means for producing a second signal which adjusts to variations in an internal voltage and coupled to the means for simulating a word line and to the internal voltage; and
means for producing a third signal indicating when the word line signal reaches a second predetermined voltage and coupled to the means for producing a first signal, and to the means for producing a second signal which adjusts to variations in an internal voltage.

9. The means for tracking a word line signal of claim 5 wherein the means for simulating a word line comprises:
means for driving a line signal in response to receiving an active word line signal;
means for producing electrical characteristics substantially equal to a word line and coupled to the means for driving; and
means for selectively coupling an external voltage to the means for producing first signal in response to the activation of the means for producing electrical characteristics substantially equal to a word line.

10. The means for tracking a word line signal of claim 9 wherein the active word line signal is generated using a row decoder in the memory device.

11. The means for tracking a word line signal of claim 9 wherein the means for driving is an inverter circuit.

12. The means for tracking a word line signal of claim 9 wherein the means for driving is a row decoder circuit.

13. The means for tracking a word line signal of claim 9 wherein the means for simulating a word line further comprises:
means for selectively coupling a voltage potential which is less than the bias voltage to the means for producing a first output signal in response to the active word line signal.

14. A computer system comprising:
a processor; and
a memory device coupled to the processor, the memory device comprising:
a voltage supply input for receiving an external voltage supply having an upper voltage level;
a plurality of memory cells arranged in rows and columns;
a plurality of access devices coupled between the plurality of memory cells and a digit line;
a plurality of word lines coupled to the plurality of access devices, the plurality of word lines for communicating word line signals to selectively activate the plurality of access devices; and
a tracking circuit for tracking the word line signals and producing an output which indicates when the word line signals reach a predetermined voltage level, the tracking circuit comprising a first comparator circuit having a first input and a second input, a word line simulation circuit coupled to the first input, and a bias circuit coupled to the second input for providing a bias voltage to the first comparator circuit.

15. The computer system of claim 14 wherein the word line signal of the memory device has an upper voltage level greater than the upper voltage level of the external voltage supply.

16. The computer system of claim 14 wherein the predetermined voltage level of the memory device is equal to a digit line equilibrate voltage plus an n-channel transistor threshold voltage.

17. The computer system of claim 16 wherein the digit line equilibrate voltage is equal to one-half the upper voltage level of the external voltage supply.

18. The computer system of claim 14 wherein the memory device is a dynamic random access memory (DRAM).

19. The computer system of claim 14 wherein the bias circuit in the memory device comprises:
a digit line simulation circuit, the digit line simulation circuit comprising a pair of digit lines, and memory cell access devices.

20. The computer system of claim 14 wherein the bias circuit in the memory device comprises:
a first linear resistor having one node connected to the second input and a second node connected to a lower voltage level; and
a second linear resistor having one node connected to the second input and a second node connected to an upper voltage level.

21. The computer system of claim 14 wherein the memory device further comprises:
a second comparator circuit having a first input coupled to the word line simulation circuit and a second input coupled to a predetermined internal voltage;
a logic gate having a first input connected to the first and second comparator circuits for producing an output signal which indicates when a word line signal reaches a predetermined voltage.

22. A method of tracking word line voltages in a memory device, the method comprising the steps of:
producing a first equilibrate voltage approximating a voltage created by shorting together two oppositely charged digit lines in the memory device;
comparing a simulated word line signal to the first equilibrate voltage;
producing a first output signal when the simulated word line signal reaches a first predetermined voltage differential above the first equilibrate voltage;
producing a second equilibrate voltage approximating a voltage created by coupling the two digit lines to an internal voltage;
comparing the simulated word line signal to the second equilibrate voltage;
producing a second output signal when the simulated word line signal reaches a second predetermined voltage differential above the second equilibrate voltage;
gating the first and second output signals together; and
producing a third output when either the first or second output signal has reached a predetermined voltage.

23. The method of claim 22, wherein the step of producing a first equilibrate voltage comprises the steps of:

arranging two matched linear resistors between a lower voltage level and an upper voltage level to function as a voltage divider; and drawing the first equilibrate voltage from a center tap of the voltage divider.

24. The method of claim 22, wherein the step of producing a first equilibrate voltage comprises the steps of:

arranging a pair of digit lines, a plurality of non-operational memory cells, a plurality of n-channel access transistors, and a sense amplifier to simulate a column in the memory device; and drawing the first equilibrate voltage from one of the digit lines.

25. The method of claim 22, wherein the step of producing a second equilibrate voltage comprises the step of providing a regulated voltage that is approximately one-half the internal voltage.

26. The method of claim 22, further comprising the step of providing a simulated word line signal using a resistor and capacitor network having electrical characteristics substantially equal to a word line in the memory device.

27. The method of claim 22, further comprising the step of setting the first predetermined voltage differential to an n-channel transistor threshold voltage.

28. The method of claim 22, further comprising the step of setting the second predetermined voltage differential to an n-channel transistor threshold voltage.

29. The method of claim 22, further comprising the step of setting the predetermined voltage to a level equivalent to a logical one.

* * * * *